(12) United States Patent
Ng et al.

(10) Patent No.: US 8,765,537 B2
(45) Date of Patent: Jul. 1, 2014

(54) METAL GATE FILL BY OPTIMIZING ETCH IN SACRIFICIAL GATE PROFILE

(75) Inventors: Man Fai Ng, Poughkeepsie, NY (US); Bin Yang, Mahwah, NJ (US)

(73) Assignee: Globalfoundries Inc., Grand Cayman (KY)

( * ) Notice: Subject to any disclaimer, the term of this patent is extended or adjusted under 35 U.S.C. 154(b) by 138 days.

(21) Appl. No.: 13/606,035

(22) Filed: Sep. 7, 2012

(65) Prior Publication Data
US 2013/0005128 A1   Jan. 3, 2013

Related U.S. Application Data

(62) Division of application No. 12/750,340, filed on Mar. 30, 2010, now abandoned.

(51) Int. Cl.
*H01L 21/338* (2006.01)
(52) U.S. Cl.
USPC ............... 438/183; 257/E21.44; 257/E21.453
(58) Field of Classification Search
CPC ................... H01L 21/28114; H01L 29/66545; H01L 29/66871
USPC .................... 438/183; 257/E21.444, E21.453
See application file for complete search history.

(56) References Cited

U.S. PATENT DOCUMENTS

| 5,472,564 A * | 12/1995 | Nakamura et al. ............... 216/51 |
| 2002/0132437 A1* | 9/2002 | Tsou et al. ...................... 438/341 |
| 2004/0104411 A1* | 6/2004 | Joubert et al. ................. 257/204 |

* cited by examiner

*Primary Examiner* — Daniel Whalen
(74) *Attorney, Agent, or Firm* — Ditthavong & Steiner, P.C.

(57) ABSTRACT

A high-k metal gate electrode is formed with reduced gate voids. An embodiment includes forming a replaceable gate electrode, for example of amorphous silicon, having a top surface and a bottom surface, the top surface being larger than the bottom surface, removing the replaceable gate electrode, forming a cavity having a top opening larger than a bottom opening, and filling the cavity with metal. The larger top surface may be formed by etching the bottom portion of the amorphous silicon at greater temperature than the top portion, or by doping the top and bottom portions of the amorphous silicon differently such that the bottom has a greater lateral etch rate than the top.

20 Claims, 5 Drawing Sheets

METAL GATE FILL BY OPTIMIZING ETCH IN SACRIFICIAL GATE PROFILE

CROSS-REFERENCE TO RELATED APPLICATIONS

This application is a divisional application of U.S. patent application Ser. No. 12/750,340, filed Mar. 30, 2010, the entirety of which is incorporated herein by reference.

TECHNICAL FIELD

The present disclosure relates to semiconductor devices with replacement metal gate electrodes. The present disclosure is particularly applicable to 32 nanometer (nm) technology nodes and beyond.

BACKGROUND

Gate last high-k metal gate (HKMG), also called replacement gate, techniques have been developed to address problems attendant upon substituting metal gate electrodes for polysilicon gate electrodes. For example, an amorphous silicon (a-Si) or polysilicon gate is used during initial processing until high temperature annealing to activate source/drain implants has been implemented. Subsequently, the a-Si or polysilicon is removed and replaced with a metal gate.

Replacement gates are being employed, especially in 32 nm, 28 nm, and 22 nm technology nodes. However, "metal gate voids" result from the gate metal fill processes, particularly at such small pitches. Adverting to FIG. 1, after polysilicon has been removed, the gate profile 101 exhibits a bottle-neck shape 103 at the top. During the metal fill process, the bottle-neck part "pinches-off" by the gate metal (titanium nitride (TiN) barrier 105 and aluminum (Al) 107) before the bottom of the gate is completely filled with metal. Also, TiN and aluminum Al tend to fill thicker at the top of the gate than at the bottom of the gate. This causes incomplete metal-gate fill, or voids 109 in the metal gate. Voids cause work function issues, such as variations in $V_t$, as well as high gate resistance and ac $R_{eff}$ penalty.

Attempts have been made to fabricate substantially vertical gate profiles to eliminate voids. However, a vertical profile is difficult to obtain with a reactive ion etch (RIE) process. Further attempts have been made to fill the barrier metal and Al gate metal substantially conformally to eliminate voids. However, TiN and Al (especially Al) do not readily fill conformally.

A need therefore exists for improved methodology enabling formation of void-free metal gates.

SUMMARY

An aspect of the present disclosure is a semiconductor device having a gate electrode with a critical dimension larger at a top surface than near a bottom surface.

Another aspect of the present disclosure is a method of fabricating a semiconductor device having a gate electrode with a critical dimension larger at a top surface than near a bottom surface.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming a replaceable gate electrode having a top surface and a bottom surface, the top surface being larger than the bottom surface; removing the replaceable gate electrode, forming a cavity having a top opening larger than a bottom opening; and filling the cavity with metal.

Aspects of the present disclosure include forming a layer of amorphous silicon on a substrate, the layer of amorphous silicon having a top surface and a bottom surface; and etching the amorphous silicon layer such that the top surface is larger than the bottom surface. Further aspects include etching the top portion of the amorphous silicon at a first temperature; and etching the bottom portion of the amorphous silicon at a second temperature greater than the first. Other aspects include the depth of the top portion comprising about one half a thickness of the amorphous silicon layer. Additional aspects include the first temperature being about room temperature; and the second temperature being about 350° C. to about 400° C. Another aspect includes etching the amorphous silicon by reactive ion etching. Further aspects include forming an oxide sidewall on the etched top portion prior to etching the bottom portion. Other aspects include implanting Boron (B) dopant increasing in concentration from a first concentration, at the bottom surface, to a second concentration, greater than the first, at the top surface. Additional aspects include the second concentration being about four orders of magnitude greater than the first concentration. Another aspect includes applying different energies for doping the top and bottom portions. Other aspects include the amorphous silicon layer having a top surface and a bottom surface, the method further comprising in-situ doping the amorphous silicon layer with a dopant to form a concentration gradient of the dopant between the top surface and the bottom surface. Further aspects include the dopant comprising B, and the concentration near the top surface being greater than the concentration near the bottom surface. Additional aspects include the dopant comprising phosphorus (P), and the concentration near the top surface being less than the concentration near the bottom surface.

Another aspect of the present disclosure is a device comprising: a silicon substrate; and a metal gate electrode formed on the silicon substrate, the metal gate electrode having a top surface, a bottom surface smaller than the top surface, and side surfaces.

Aspects include the side surfaces of the metal gate electrode forming an angle of about 80° to about 85° with the top surface. Further aspects include sidewall spacers on side surfaces of the metal gate electrode, wherein the metal gate electrode comprises a replacement gate electrode formed by depositing titanium nitride (TiN) or aluminum (Al) between the sidewall spacers.

Another aspect of the present disclosure is a method comprising: forming a layer of amorphous silicon on a substrate, the amorphous silicon layer having a top portion and a bottom portion, and side surfaces; differentially etching the top portion and the bottom portion to form a replaceable gate electrode having a top surface larger than a bottom surface; forming sidewall spacers on the side surfaces of the amorphous silicon layer; removing the amorphous silicon, forming a cavity between the sidewall spacers having a top opening larger than a bottom opening; and filling the cavity with metal to form a high-k metal gate electrode.

Further aspects include etching the top portion at about room temperature; forming a protective oxide sidewall at a thickness of about 1 nm to about 3 nm on the etched top portion; and etching the second portion at about 350° C. to about 400° C. Additional aspects include implanting a B dopant in the amorphous silicon, prior to etching, such that the top portion comprises a higher concentration of B than the bottom portion. Another aspect includes doping the amorphous silicon in situ with a dopant, such that the dopant exhibits a concentration gradient between the top and bottom surfaces of the amorphous silicon layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
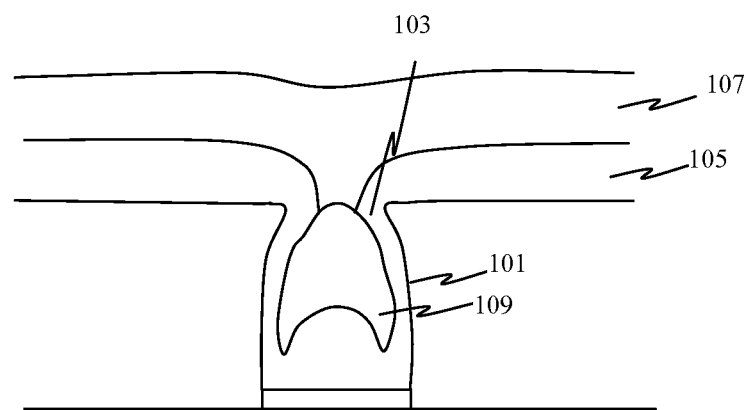
FIG. 1 schematically illustrates a prior art gate electrode with metal gate voids.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the metal gate void problems attendant upon forming replacement gate electrodes. In accordance with embodiments of the present disclosure, a sacrificial gate profile is formed with a larger critical dimension at the top of the gate than at the bottom of the gate. Consequently, after the sacrificial gate material is removed, a bottleneck is not formed at the top, and the gate metal fills the gate uniformly. Accordingly, voids in the metal gate can be eliminated.

Methodology in accordance with embodiments of the present disclosure includes forming a replaceable gate electrode having a top surface and a bottom surface, the top surface being larger than the bottom surface, removing the replaceable gate electrode, forming a cavity having a top opening larger than a bottom opening, and filling the cavity with metal.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2G schematically illustrate sequential steps of a method in accordance with an exemplary embodiment. Adverting to FIG. 2A, after gate dielectric 201, for example an oxide layer, TiN layer 203, and amorphous silicon (a-Si) layer 205 are formed on silicon substrate 207, a hard mask 209, for example of silicon nitride (SiN) is formed and patterned on a-Si layer 205.

Figure 2A:
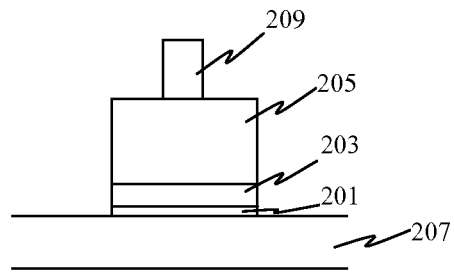
FIGS. 2A to 2G schematically illustrate sequential steps of a method in accordance with an exemplary embodiment.
Figure 2B:
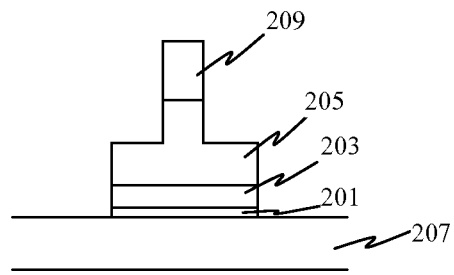

A first anisotropic RIE etches approximately half way into the a-Si, using hard mask 209 as a mask, as illustrated in FIG. 2B. The RIE process may take place with the chuck in the etch chamber at about room temperature (between about 21° C. and about 25° C.).

Figure 2C:
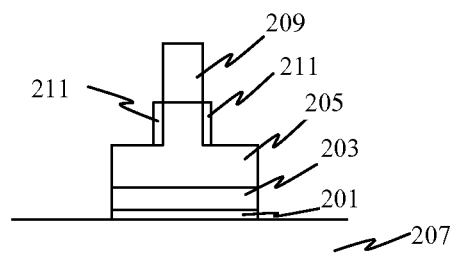

As shown in FIG. 2C, a thin oxide 211, is formed on the side surface of the etched a-Si. Oxide 211 may be formed, for example, at a thickness of a few nanometers or less, e.g., about 1 nm to about 3 nm. The oxide sidewall protects the top portion of the a-Si to minimize lateral etch during subsequent etching. During the sidewall thin oxide 211 formation, an oxide layer may also be formed on the remaining silicon surface. However, the directional nature of RIE will remove that layer but not the sidewall oxide.

Figure 2D:
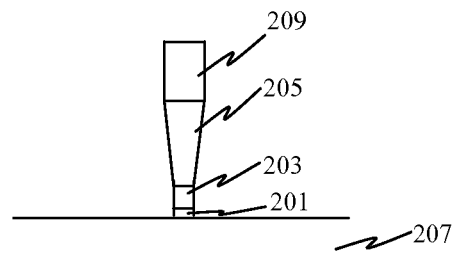
Figure 2E:
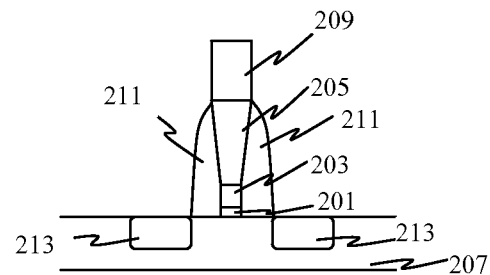
Figure 2F:
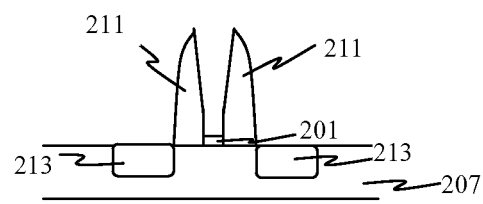

Etching of a-Si layer 205, as well as TiN layer 203 and gate dielectric 201, continues with a second RIE step. A higher chuck temperature, for example 350° C. to about 400° C., is employed, thereby causing more lateral undercut to the bottom portion of a-Si, i.e., the portion without oxide sidewall protection. Accordingly, the resulting profile, illustrated in FIG. 2D, is narrower at the bottom than at the top. For example, the bottom may be about 30 nm, and the sides of a-Si may form an angle 213 with substrate 207 of about 80° to about 85°. After the etching is complete, the oxide sidewall may be removed by DHF clean.

Figure 2G:
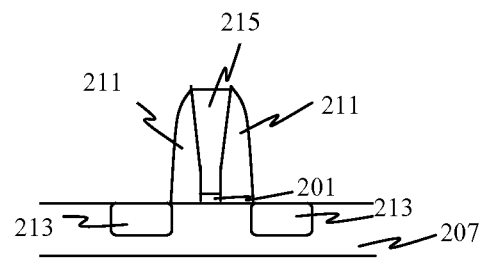

Subsequently, conventional processing continues with the formation of spacers 211 and source/drain 213 (shown in FIG. 2E), removal of hard mask 209 and a-Si 205 (shown in FIG. 2F), and filling of the gate with metal, such as aluminum. The larger opening at the top of the gate makes the gate metal fill process much easier, such that a void free gate 215 may be formed, as illustrated in FIG. 2G.

Figure 3A:
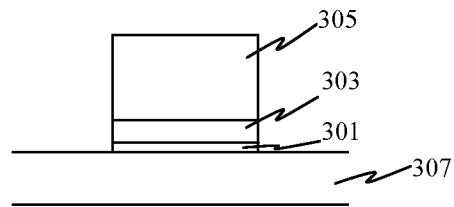
FIGS. 3A to 3G schematically illustrate sequential steps of a method in accordance with another exemplary embodiment.
Figure 3B:
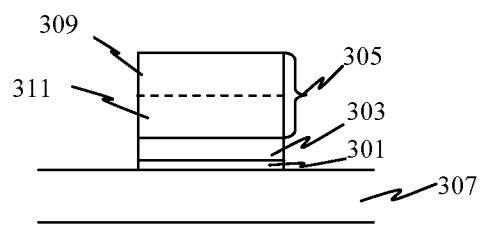

FIGS. 3A to 3G schematically illustrate sequential steps of a method in accordance with another exemplary embodiment. Adverting to FIG. 3A, gate dielectric 301, for example an oxide layer, TiN layer 303, and a-Si layer 305 are formed on silicon substrate 307. As illustrated in FIG. 3B, a-Si layer 305 is implanted with a dopant, for example B. Through single or multiple energy and dose implants, a higher concentration of dopant in top portion 309 than in bottom portion 311. Top portion 309 may be implanted with a B concentration about four orders of magnitude greater than the bottom portion, for example a concentration of about 1E21 to about 1E22, versus about 1E18 for the bottom portion.

Figure 3C:
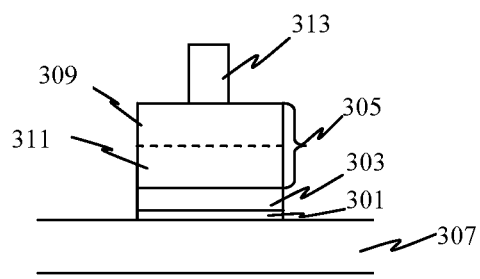

A hard mask 313 is formed on doped a-Si layer 305, as illustrated in FIG. 3C. a-Si layer 305 is then etched using hard mask 313 as a mask. Since the silicon etch rate reduces monotonously with increasing B concentration, by tailoring the dopant profile implanted into the a-Si gate, a larger critical dimension (via a smaller lateral etch) can be created at the top of the gate than at the bottom of the gate. The result is illustrated in FIG. 3D.

Alternatively, instead of doping a-Si layer 305 after forming the layer, doping may be performed in situ during formation of the layer. Relative dopant concentrations may be selected according to whether the dopant enhances or reduces the lateral etch rate. For example, top portion 309 may be doped with a higher concentration of B dopant, which reduces the lateral etch rate, or with a lower concentration of P dopant, which enhances lateral etch rate. With the resultant concentration gradient of dopant, a-Si layer 305 etches more at the bottom portion than at the top portion, thereby creating a larger critical dimension at the top of the gate than at the bottom of the gate, as shown in FIG. 3D.

Figure 3D:
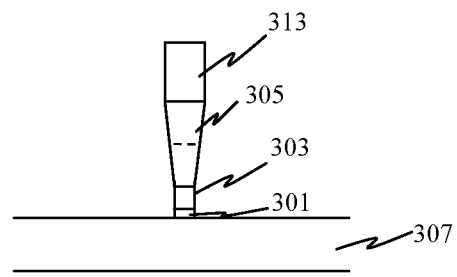
Figure 3E:
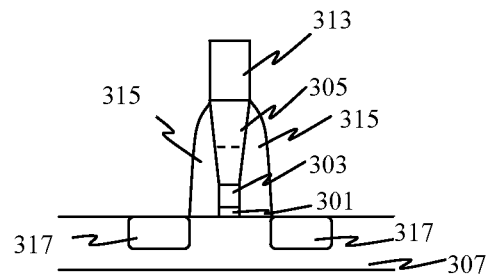
Figure 3F:
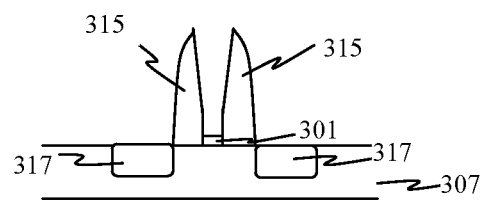
Figure 3G:
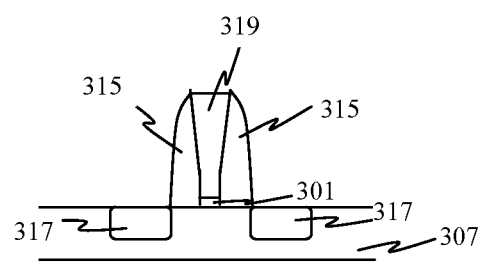

After the a-Si gate is formed as illustrated in FIG. 3D, conventional processing continues with the formation of spacers 315 and source/drain 317 (shown in FIG. 3E), removal of hard mask 313 and a-Si 305 (shown in FIG. 2F), and filling of the gate with metal, such as aluminum. Because of the larger opening at the top of the gate, the metal fills the opening more evenly such that a void free gate 319 may be formed, as illustrated in FIG. 3G.

The embodiments of the present disclosure can achieve several technical effects, including void free metal gates, which in turn reduces $V_t$ variations, gate resistance, and ac $R_{eff}$ penalty. The present disclosure enjoys industrial applicability in any of various types of highly integrated semiconductor devices, particularly 32 nm nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a replaceable gate electrode having a top surface and a bottom surface, the top surface being larger than the bottom surface, by:
   forming a layer of amorphous silicon on a substrate, the layer of amorphous silicon having a top portion with a top surface and a bottom portion with a bottom surface,
   etching the top portion of the layer of amorphous silicon at a first temperature, and
   etching the bottom portion of the layer of amorphous silicon at a second temperature greater than the first;
   removing the replaceable gate electrode, forming a cavity having a top opening larger than a bottom opening; and
   filling the cavity with metal.

2. The method according to claim 1, wherein a depth of the top portion comprises about one half a thickness of the layer of amorphous silicon.

3. The method according to claim 1, wherein:
   the first temperature is about 21° C. to about 25° C.; and
   the second temperature is about 350° C. to about 400° C.

4. The method according to claim 1, comprising etching the amorphous silicon by reactive ion etching.

5. The method according to claim 1, further comprising forming an oxide sidewall on the etched top portion prior to etching the bottom portion.

6. The method according to claim 5, comprising forming the oxide sidewall to a thickness of 1 nanometer (nm) to 3 nm.

7. The method according to claim 5, comprising removing the oxide sidewall after etching the bottom portion of the layer of amorphous silicon.

8. The method according to claim 1, comprising forming a patterned hardmask on the top surface of the layer of amorphous silicon prior to etching the top portion.

9. The method according to claim 1, comprising forming sidewalls of the replaceable gate electrode to an angle of about 80° to about 85° with the substrate.

10. The method according to claim 9, comprising forming the bottom surface of the replaceable gate electrode to a width of about 30 nm.

11. A method comprising:
    forming a layer of amorphous silicon on a substrate, the amorphous silicon layer having a top portion and a bottom portion;
    differentially etching the top portion and the bottom portion to form a replaceable gate electrode having a top surface larger than a bottom surface by:
    etching the top portion at about 21° C. to about 25° C.,
    forming a protective oxide sidewall at a thickness of about 1 nm to about 3 nm on the etched top portion, and
    etching the bottom portion at about 350° C. to about 400° C.;
    forming sidewall spacers on the side surfaces of the replaceable gate electrode;
    removing the amorphous silicon, forming a cavity between the sidewall spacers having a top opening larger than a bottom opening; and
    filling the cavity with metal to form a high-k metal gate electrode.

12. The method according to claim 11, wherein a depth of the top portion comprises about one half a thickness of the layer of amorphous silicon.

13. The method according to claim 11, comprising etching the amorphous silicon by reactive ion etching.

14. The method according to claim 11, comprising removing the protective oxide sidewall after etching the bottom portion of the layer of amorphous silicon.

15. The method according to claim 11, comprising forming a patterned hardmask on the top surface of the layer of amorphous silicon prior to etching the top portion.

16. The method according to claim 11, comprising forming sidewalls of the replaceable gate electrode to an angle of about 80° to about 85° with the substrate.

17. The method according to claim 16, comprising forming the bottom surface of the replaceable gate electrode to a width of about 30 nm.

18. A method comprising:
    forming a layer of amorphous silicon on a substrate, the amorphous silicon layer having a top portion and a bottom portion, the top portion having a depth about one half a thickness of the layer of amorphous silicon;
    forming a patterned hardmask over the layer of amorphous silicon;
    etching the top portion at about 21° C. to about 25° C. through the hardmask;
    forming a protective oxide sidewall at a thickness of about 1 nm to about 3 nm on the etched top portion;
    etching the bottom portion at about 350° C. to about 400° C. through the hardmask;
    removing the protective oxide sidewall;
    forming sidewall spacers on side surfaces of the etched top and bottom portions, the side surfaces being at an angle of about 80° to about 85° with the substrate;
    removing the hardmask and remaining amorphous silicon, forming a cavity between the sidewall spacers having a top opening larger than a bottom opening; and
    filling the cavity with metal to form a high-k metal gate electrode.

19. The method according to claim 18, wherein a bottom surface of the cavity has a width of about 30 nm.

20. The method according to claim 18, comprising etching the top and bottom portions by reactive ion etching.

* * * * *